United States Patent [19]
Kobayashi

[11] Patent Number: 5,784,689
[45] Date of Patent: Jul. 21, 1998

[54] OUTPUT CONTROL CIRCUIT FOR TRANSMISSION POWER AMPLIFYING CIRCUIT

[75] Inventor: Takeshi Kobayashi, Tokyo, Japan

[73] Assignee: NEC Corporation, Tokyo, Japan

[21] Appl. No.: 576,966

[22] Filed: Dec. 26, 1995

[30] Foreign Application Priority Data

Dec. 30, 1994 [JP] Japan ............................... 6-340430

[51] Int. Cl.$^6$ .............................. H04B 1/06; H03G 3/10
[52] U.S. Cl. .................. 455/126; 455/127; 330/137; 330/279
[58] Field of Search ........................... 455/126, 127; 330/137, 279, 129, 138, 133, 134, 285

[56] References Cited

U.S. PATENT DOCUMENTS 5,194,823  3/1993  Wendt et al. ........................ 455/126
5,309,115  5/1994  Hashimoto et al. .................. 455/127
5,511,239  4/1996  Dennerlein et al. ................. 455/126

*Primary Examiner*—Donnie L. Crosland
*Attorney, Agent, or Firm*—Sughrue, Mion, Zinn, Macpeak & Seas, PLLC

[57] ABSTRACT

A higher output of two outputs from a trapezoidal wave generating circuit 4 and a pulse generating circuit 5 is produced. The control voltage signal is formed by combining the trapezoidal wave signal and the pulse signal. Sharp rising and falling edges of the pulse voltage are selected for controlling the transmission power amplifying circuit 1 in a voltage range below a predetermined voltage level, whereas gentle rising and falling edges of the trapezoidal wave signal are used for controlling the circuit 1 in a voltage range above that voltage level.

10 Claims, 3 Drawing Sheets

(a) BURST SIGNAL
(b) TRAPEZOIDAL WAVEFORM
(c) OUTPUT OF LPF
(d) PULSE WAVEFORM
(e) COMBINED WAVEFORM (ADDER)

OUTPUT CONTROL CIRCUIT FOR TRANSMISSION POWER AMPLIFYING CIRCUIT

BACKGROUND OF THE INVENTION

The present invention relates to an transmission power amplifying circuit and, more particularly, to an output control circuit for amplifying the digital signals such as a digital radio transmitter.

In a radio transmitter of a TDMA system using a modulation system in which FM or other modulation carrier signals have certain envelope in general, the intermittent transmission of the power signal having sharp rise and fall waveform edges such as a burst signal causes a spread of the transmission power spectrum due to the abrupt change of the carrier wave amplitude at the rising and falling edges. This results in undesirable influence to the adjacent channels such as inter modulation.

Figure 5:
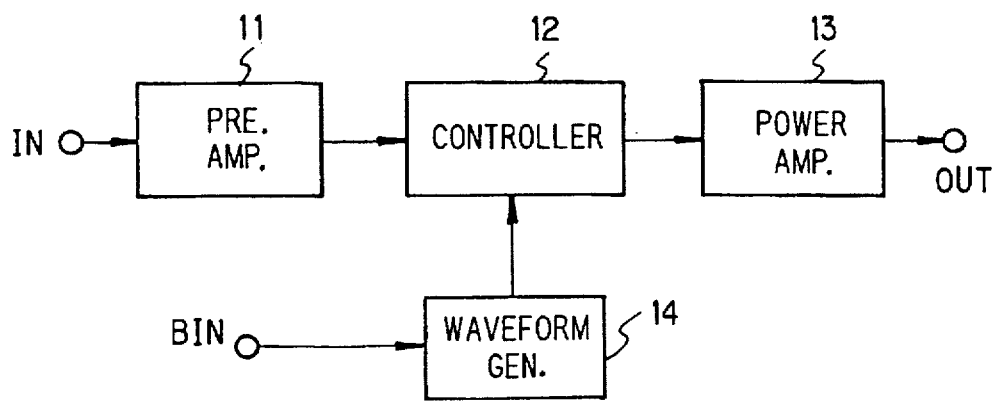

Attempts have been made to mollify such sharp rising and falling edges by controlling the signal waveform. For example, Japanese Patent Laid-Open No. 59-226519 proposes a circuit as illustrated in FIG. 5 of the accompanying drawings for such purpose. Referring to the circuit diagram, a rectangular burst signal is applied to a burst signal input terminal BIN in response to a burst carrier signal. Upon receiving the burst signal, a control waveform with a gentle change in time is produced by a waveform generating circuit 14 to control a control circuit 12.

On the other hand, the burst carrier signal from the input terminal IN is amplified by the preamplifier 11 and supplied to a power amplifying circuit 13 as an input signal having an envelope similar to that of the control waveform. The envelope of the input signal is modified to make the gentle rising and falling slope waveform around the operation range of the power amplifying circuit, thereby suppressing the spread of spectrum.

Japanese Patent Laid-Open Publication No. 5-316012 discloses another method of suppressing the spectrum spread by using a control voltage having a trapezoidal waveform to produce the envelope of the transmission output signal having the trapezoidal waveform with rising and falling edges of desired slopes.

While a number of methods including the above cited methods have been proposed to suppress the spectrum spread by using gentle rising and falling edges. However, these methods merely try to make the rising and falling edges gentle, causing the following problems. It is true that the gentle rising and falling edges suppresses the spread of the power spectrum. More gentle rising and falling edges necessitates a considerably longer time to obtain a predetermined level of the transmission power signal, degrading the output response time characteristic. It is therefore determine the slope degree of rising and falling edges on the basis of the relationship between the spread of the power spectrum and the output response time characteristic in the prior methods. As a result, it is very difficult to set a sufficient gentleness of the rising and falling edges to suppress the spectrum spread within a desired level.

SUMMARY OF THE INVENTION

It is therefore an object of the present invention to provide an output control circuit for a transmission power amplifying circuit capable of sufficiently suppressing the spread of the power spectrum and improving the output response time characteristic.

According to the present invention, a control voltage signal for controlling the transmission power amplifying circuit is formed by combining a trapezoidal wave signal and a pulse wave signal. The pulse wave signal having sharp rising and falling edges is used as the control signal to control the transmission power amplifying circuit in a voltage range below a predetermined power level, whereas a trapezoidal wave signal having gentle rising and falling edges is used as the control signal to control the transmission power amplifying circuit in a range above the predetermined level, thereby effectively suppressing the spread of the power spectrum at a high power output level and improving the output response time characteristic or reducing the output response time.

According to an aspect of the present invention, there is provided an output control circuit for a transmission power amplifying circuit designed to amplify the power of an input signal in response to a control signal waveform comprising: a trapezoidal wave generating circuit for generating a trapezoidal wave signal having rising and falling edges gentler than those of a burst signal; a pulse generating circuit for generating a pulse signal having a sharp rising edge in synchronization with corresponding rising edge of the burst signal and a sharp falling edge slightly delayed from corresponding falling edge of the burst signal; and an adder for producing either the trapezoidal wave signal or the pulse signal, whichever having a higher level, as the control signal.

According to another aspect of the present invention, there is provided an output control circuit for a transmission power amplifying circuit designed to amplify the power of an input burst signal in response to a control signal comprising: a first circuit for producing a trapezoidal waveform signal waveform which rises in response to the rising of the input burst signal; a second circuit for producing a pulse signal waveform which rises in response to the rising of the input burst signal; a third circuit for selectively outputting a higher level output of the outputs from the first and second circuits; a fourth circuit for detecting an output level of the transmission power amplifying circuit; and a fifth circuit for producing a difference between the outputs of the third and fourth circuits as the control signal.

Other objects and features will clarified from the following description with reference to attached drawings.

PREFERRED EMBODIMENTS OF THE INVENTION

Figure 1:
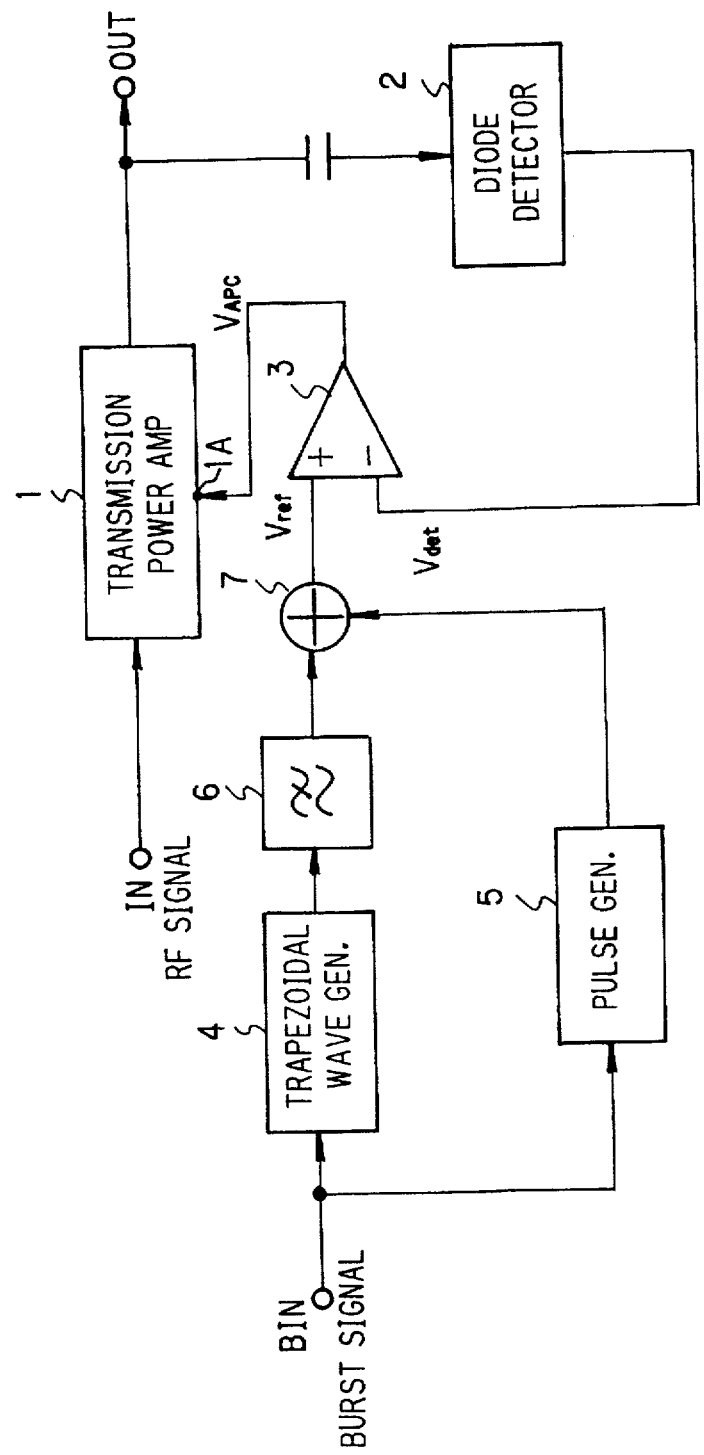

Now, the present invention will be described by referring to the accompanying drawings that illustrate a preferred embodiment of the present invention. FIG. 1 is a block diagram of an embodiment to be suitably used for a transmission power amplifying circuit having an automatic output control function. Referring to FIG. 1, a modulated transmission signal is supplied to a transmission power amplifying circuit 1 through a high frequency signal input terminal IN and amplified therein. The amplified signal is then outputted from an output terminal OUT. The amplification degree of the transmission power amplifying circuit 1 is controlled by a control voltage $V_{APC}$ supplied to an output control terminal 1A provided in the circuit 1. Note that the degree of amplification or the output level of the transmission power amplifying circuit 1 is automatically controlled as will be described below. More specifically, part of the output signal outputted from the output terminal OUT is extracted and detected by a diode detector circuit 2 as a voltage corresponding to the output power level. Thus detected voltage is then supplied to one of a pair of input terminals of a comparator 3 as a detection voltage $V_{det}$. The voltage produced by the comparator 3 is used as a control voltage $V_{APC}$ for the transmission power amplifying circuit 1.

On the other hand, a burst signal input terminal BIN for receiving a burst signal is connected to a trapezoidal wave generating circuit 4 and a pulse generating circuit 5. In response to the rising and falling edges of the burst signal, the trapezoidal wave generating circuit 4 generates a trapezoidal wave having gently inclined rising and falling edges of a required voltage level. While any circuit configuration adapted to generate the trapezoidal wave may be used for the purpose of the present invention, an integration circuit may be used to generate a wave substantially equivalent to the trapezoidal wave in this embodiment. The trapezoidal wave generating circuit 4 can generate a trapezoidal wave having desired gentle slope by controlling certain parameters.

The pulse generating circuit 5 generates a pulse signal which rises in synchronization with the corresponding rising edge of the burst signal and falls with slightly delayed time from the corresponding falling edge thereof. Thus, the pulse signal having a pulse width longer than that of the burst signal is obtainable. The pulse generating circuit 5 is capable of arbitrarily setting the signal voltage level to a level lower than that of the trapezoidal wave generated by the trapezoidal wave generating circuit 4. A low-pass filter 6 is connected to the output of the trapezoidal wave generating circuit 4 to remove high frequency components from the trapezoidal wave generated by the circuit. The outputs of the low-pass filter 6 and the pulse generating circuit 5 are supplied to an adder 7. The output of the adder 7 is then supplied to the other input terminal of the comparator 3 as the reference voltage $V_{ref}$.

Figure 2:
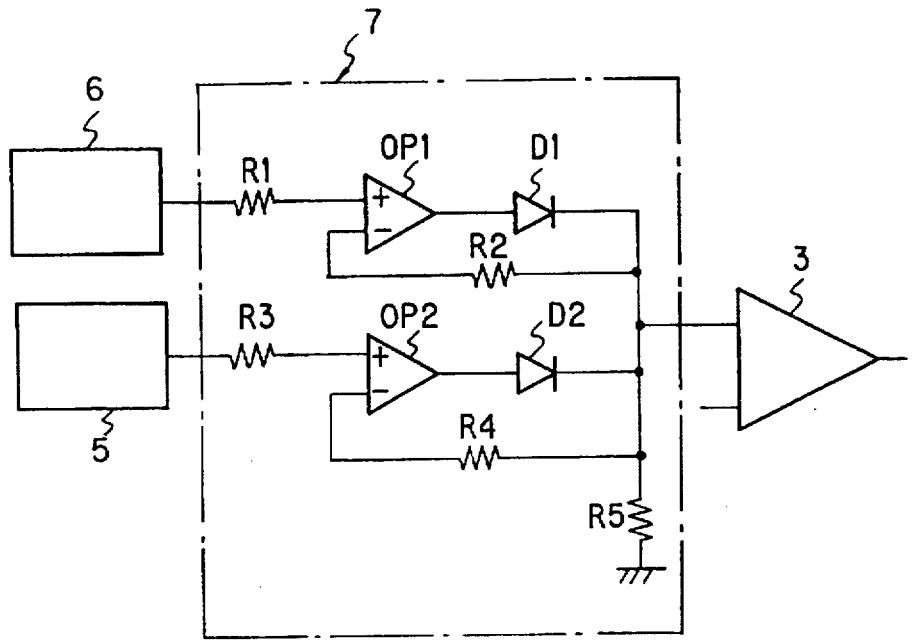

As seen from FIG. 2, the adder 7 comprises operational amplifiers OP1 and OP2 for receiving respectively the trapezoidal wave signal and the pulse signal, resistors R1 through R5 and diodes D1 and D2. The input voltages of the trapezoidal wave signal and the pulse signal are compared by feeding back the outputs of the operational amplifiers OP1 and OP2 and produces a higher voltage of the two input voltages, as the output of the adder 7.

Figure 3:
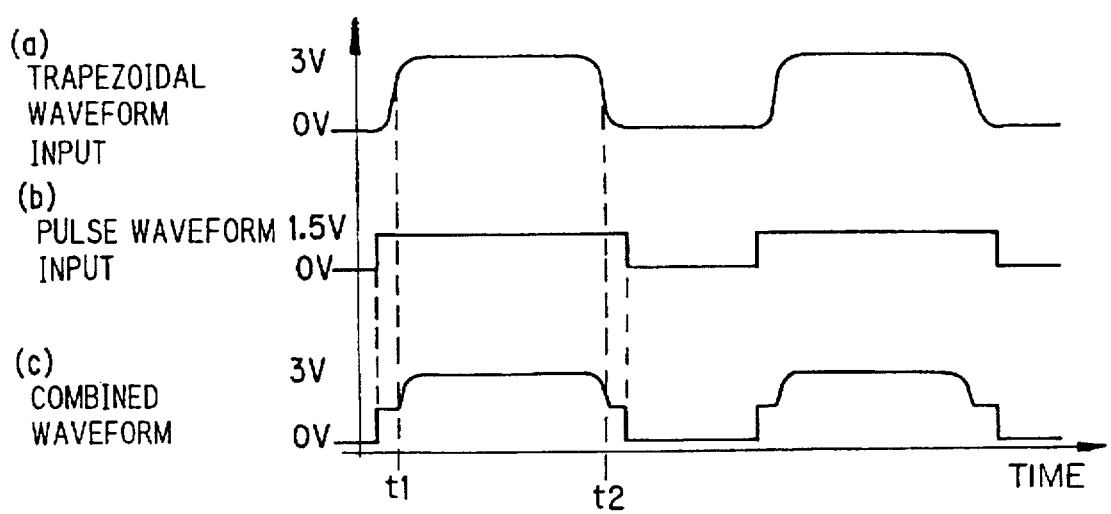

More specifically, assuming that a 3 V trapezoidal wave signal as shown in FIG. 3(a) and a 1.5 V pulse signal as shown in FIG. 3(b) are supplied to the adder 7, the higher voltage is produced so that the pulse signal having a sharp rising edge is produced as the output signal of the adder in the initial stage of the rising edge until time $t_1$, when the rising edge exceeds the 1.5 V level the output signal of the adder is switched to the trapezoidal wave signal. From then on, the adder 7 continues to produce the trapezoidal wave signal as its output until its voltage falls below the 1.5 V level at time $t_2$, when it is switched back to the pulse signal having the sharp falling edge.

Figure 4:
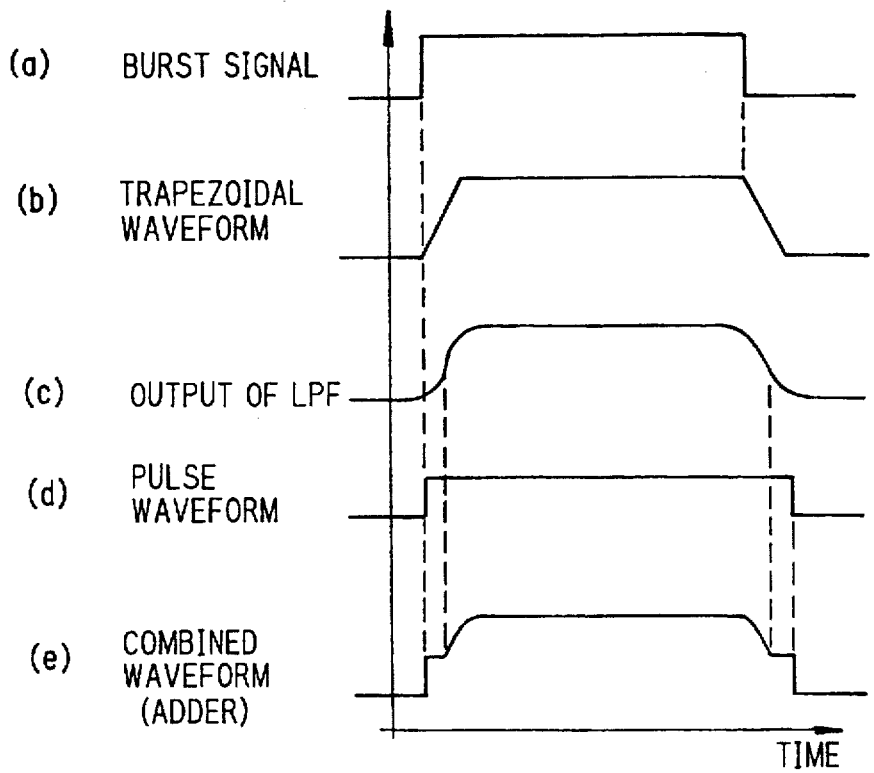

The circuit having a configuration as illustrated in FIG. 1 operates in a manner as described below. As the burst signal illustrated in FIG. 4(a) is supplied to the input terminal BIN, the trapezoidal wave generating circuit 4 generates the trapezoidal wave signal having a predetermined voltage level as shown in FIG. 4(b) as its output. The trapezoidal wave signal is then supplied to the low-pass filter 6, where high frequency components are removed to produce the trapezoidal wave signal having gentler slopes.

On the other hand, as the burst signal shown in FIG. 4(a) is supplied to the pulse generating circuit 5, a pulse signal having a pulse width wider than that of the burst signal and a voltage level lower than that of the trapezoidal wave signal is produced. Supplied with the trapezoidal wave signal and the pulse signal, the adder 7 produces a trapezoidal wave signal having a desired profile as shown in FIG. 4(e). This trapezoidal wave signal is thereafter supplied to the comparator 3 as the reference voltage $V_{ref}$. The comparator 3 produces a difference between the reference voltage $V_{ref}$ and the detection voltage $V_{det}$ obtained by the diode detector circuit 2. This difference is supplied to a control terminal 1A of the transmission power amplifying circuit 1 as the control voltage $V_{APC}$ to control the output of the circuit 1.

Thus, the transmission power amplifying circuit 1 amplifies the high frequency signal to an extent of amplification that corresponds to the trapezoidal wave signal having the desired profile. Note that the control voltage has a sharp rising edge corresponding to that of the pulse signal in the initial stage of rising and then shifts to gentler rising edge corresponding to that of the trapezoidal wave signal in the latter stage of rising as typically illustrated in FIG. 4(e). Accordingly, while the transmission power spectrum is spread in the initial stage of rising, such spread of spectrum may not be caused in any significance because of its low output level. When the output level is increased, the spectrum spread can be effectively suppressed as the control voltage is switched to the gentler rising edge of the trapezoidal wave signal.

The above description may also be applied to the case of falling edge of the control voltage. In the initial stage of falling edge of the control voltage, the gentler inclination of the trapezoidal wave signal is selected for the falling edge to effectively suppress the spread of the spectrum until the voltage level goes below a given level, and the sharp falling inclination of the pulse signal is selected thereafter. Consequently, the operation of the transmission power amplifying circuit 1 is dominated by the sharp rising and falling edges of the pulse signal in a voltage range below the predetermined voltage level, and by the gentle rising and falling edges of the trapezoidal wave signal in a voltage range higher than that the predetermined voltage level, the response time characteristic of the transmission power signal is improved and the spectrum spread is effectively suppressed.

In practice, priority may be given to either the suppression of the spread of transmission power spectrum or the improvement of output power response time characteristic, or to the both, taking their balance into account by appropriately controlling the inclination of rising and falling edges of the trapezoidal wave signal generated by the trapezoidal wave generating circuit 4 and the pulse wave signal generated by the pulse generating circuit 5 on the basis of the operating conditions of the transmitter, and the extent of amplification and the output level of the transmission power amplifying circuit 1. While the transmission power amplifying circuit 1 of the above embodiment has an automatic output control function, it may alternatively be so arranged that the output of the adder is directly applied to the control terminal of the transmission power amplifying circuit.

As described above, the control voltage signal for controlling the transmission power amplifying circuit is formed by combining the trapezoidal wave signal and the pulse signal. The pulse signal is selected for the control voltage signal in the initial stage of rising edge and then the trapezoidal wave signal is selected in the latter stage of rising edges, whereas the trapezoidal wave signal is selected in the initial stage of falling edge and then the pulse signal is selected in the latter stage of falling edge. Any possible spread of the transmission power spectrum can be effectively suppressed by the trapezoidal wave signal while the output response time can be reduced by the pulse signal.

Particularly, by selecting the voltage level of the pulse signal to a value smaller than that of the trapezoidal wave signal, sharp rising and falling edges of the pulse signal can be used for the control voltage in a voltage range below a predetermined level, whereas gentle rising and falling edges of the trapezoidal wave signal can be used therefor, suppressing the wide spread of the transmission power spectrum in the case of high output and reducing the output response time. The inclination of rising and falling edges can be further mollified and hence the possible spread of the transmission power spectrum can be more effectively suppressed by connecting a low-pass filter to the output of the trapezoidal wave generating circuit in order to remove high frequency components of the trapezoidal wave signal. Furthermore, the operation of the transmission power amplifying circuit can be stabilized by adding a detector for detecting the output of the transmission power amplifying circuit and a comparator for producing the difference between the output of the adder, which is used as a reference voltage, and that of the detector and by using the output of the comparator as the control voltage for the transmission power amplifying circuit.

Changes in construction will occur to those skilled in the art and various apparently different modifications and embodiments may be made without departing from the scope of the invention. The matter set forth in the foregoing description and accompanying drawings is offered by way of illustration only. It is therefore intended that the foregoing description be regarded as illustrative rather than limiting.

What is claimed is:

1. An output control circuit for a transmission power amplifying circuit for amplifying the power of an input signal in response to a control signal waveform comprising:
    a trapezoidal wave generating circuit for generating a trapezoidal wave signal having rising and falling edges with longer rise and fall times, respectively, than those of a burst signal;
    a pulse generating circuit for generating a pulse signal having a sharp rising edge in synchronization with corresponding rising edge of the burst signal and a sharp falling edge of the burst signal;
    an adder for producing a reference signal comprising either the trapezoidal wave signal or the pulse signal, whichever has a higher voltage level; and
    a comparator for producing a control signal which is the difference between said reference signal and a detector signal corresponding to an output of the transmission power amplifying circuit.

2. The output control circuit as set forth in claim 1, wherein the pulse generating circuit generates a pulse signal having a voltage level lower than that of a corresponding trapezoidal wave signal generated by the trapezoidal wave generating circuit.

3. The output control circuit as set forth in claim 1, wherein a low-pass filter for removing high frequency components from the trapezoidal wave signal is connected to the output of the trapezoidal wave generating circuit.

4. The output control circuit as set forth in claim 2, wherein a low-pass filter for removing high frequency components from the trapezoidal wave signal is connected to the output of the trapezoidal wave generating circuit.

5. The output control circuit as set forth in claim 1, further comprising a detector for generating said detector signal in response to detecting an output of the transmission power amplifying circuit.

6. The output control circuit as set forth in claims 3, further comprising a detector for detecting an output of the transmission power amplifying circuit and a comparator for obtaining a difference between the output of the adder to be used as a reference voltage and the output of the detector and outputting the difference as the control signal.

7. An output control circuit for a transmission power amplifying circuit for amplifying the power of an input signal in response to a control signal waveform comprising a comparator having an input reference signal and an input detector signal, said comparator generating a control signal having pulse waveform with a first rising portion, a second constant level portion, a third rising portion having a longer rise time than said first rising Portion, a fourth constant level portion, a fifth falling portion, a sixth constant level portion, and a seventh falling portion having a shorter fall time than said fifth falling portion.

8. An output control circuit for a transmission power amplifying circuit designed to amplify the power of an input burst signal in response to a control signal comprising:
    a first circuit for producing a trapezoidal waveform signal waveform which rises in response to the rising of the input burst signal;
    a second circuit for producing a pulse signal waveform which rises in response to the rising of the input burst signal;
    a third circuit for selectively outputting a higher level output of the outputs from the first and second circuits;
    a fourth circuit for detecting an output level of the transmission power amplifying circuit; and
    a fifth circuit for producing a difference between the outputs of the third and fourth circuits as the control signal.

9. The output control circuit as set forth in claim 8, further comprising a low pass filter inserted between the first and third circuits.

10. The output control circuit as set forth in claim 8, wherein the second circuit is an integration circuit.

* * * * *